United States Patent
Yoon et al.

(10) Patent No.: US 8,749,725 B2
(45) Date of Patent: Jun. 10, 2014

(54) FLAT PANEL DISPLAY APPARATUS AND METHOD OF MANUFACTURING THE SAME

(75) Inventors: Joo-Sun Yoon, Yongin (KR); Seong-Min Wang, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 316 days.

(21) Appl. No.: 13/064,651

(22) Filed: Apr. 6, 2011

(65) Prior Publication Data

US 2011/0309362 A1    Dec. 22, 2011

(30) Foreign Application Priority Data

Jun. 17, 2010 (KR) .................. 10-2010-0057567

(51) Int. Cl.
*H01L 29/10* (2006.01)
*G02F 1/1343* (2006.01)

(52) U.S. Cl.
USPC .......... 349/38; 257/72; 257/E29.151; 257/59; 349/138

(58) Field of Classification Search
CPC .............. G02F 1/136213; H01L 27/12; H01L 27/1214; H01L 27/3248; H01L 27/3265; H01L 29/4908
USPC ........... 257/59, 72, 67, E29.151; 349/38, 138
See application file for complete search history.

(56) References Cited

U.S. PATENT DOCUMENTS

| 7,297,977 | B2 | 11/2007 | Hoffman et al. | |
| 7,393,600 | B2 | 7/2008 | Inoue et al. | |
| 2005/0017244 | A1 | 1/2005 | Hoffman et al. | |
| 2006/0113539 | A1 | 6/2006 | Sano et al. | |
| 2007/0138475 | A1* | 6/2007 | Kitakado et al. | 257/66 |
| 2009/0108280 | A1* | 4/2009 | Jan et al. | 257/98 |
| 2009/0141203 | A1* | 6/2009 | Son et al. | 349/39 |

FOREIGN PATENT DOCUMENTS

| KR | 10 2006-0123765 A | 12/2006 |
| KR | 10 2008-0008618 A | 1/2008 |
| KR | 10-2008-0049256 A | 6/2008 |
| KR | 10 2009-0057689 A | 6/2009 |
| WO | WO 2005/088726 A1 | 9/2005 |
| WO | WO 2006/051993 A2 | 5/2006 |

* cited by examiner

*Primary Examiner* — Kenneth Parker
*Assistant Examiner* — Jose R Diaz
(74) *Attorney, Agent, or Firm* — Lee & Morse, P.C.

(57) ABSTRACT

A flat panel display apparatus including a gate electrode on a substrate, a first insulating layer and a semiconductor layer sequentially stacked on the gate electrode and including a transparent conductive oxide, a capacitor first electrode extending on a plane on which the gate electrode extends, and a capacitor second electrode extending on a plane on which the semiconductor layer extends and including a material of the semiconductor layer, wherein the first insulating layer is between the capacitor second electrode and the semiconductor layer, source and drain electrodes that are separated by a second insulating layer and are connected to the semiconductor layer and the capacitor second electrode, a third insulating layer covering the source and drain electrodes, and a pixel electrode electrically connected to the source or drain electrode on the third insulating layer and being electrically connected to one of the source electrode and/or the drain electrode.

19 Claims, 5 Drawing Sheets

FLAT PANEL DISPLAY APPARATUS AND METHOD OF MANUFACTURING THE SAME

BACKGROUND

1. Field

Embodiments relate to a flat panel display apparatus and a method of manufacturing the same.

2. Description of the Related Art

Flat panel display apparatuses, such as an organic light-emitting display apparatus and a liquid crystal display apparatus, are active matrix-type display apparatuses that include a plurality of pixels each including a thin film transistor and a capacitor. Thus, such flat panel display apparatus may embody high-definition displays.

Display quality of transmission-type or semi-transmission-type liquid crystal display apparatuses, in which light emitted from a backlight is externally transmitted, or bottom emission-type or bi-directional emission-type organic light-emitting display apparatuses, in which light emitted from an organic light emission layer is transmitted through a thin film transistor array substrate, may be improved by increasing transmissibility of a thin film transistor array substrate. Such improvement in transmissibility is of particular importance in high-definition displays in which a low aperture ratio may also cause relatively low transmissibility.

SUMMARY

Embodiments are therefore directed to flat panel display apparatus and methods of manufacturing the same, which substantially overcome one or more of the problems due to the limitations and disadvantages of the related art.

It is therefore a feature of an embodiment to provide a flat panel display apparatus with a high aperture ratio and high transmissibility as compared to comparable conventional devices.

It is therefore a separate feature of an embodiment to provide a method of manufacturing a flat panel display apparatus with a high aperture ratio and high transmissibility as compared to comparable conventional devices.

At least one of the above and other features and advantages may be realized by providing a flat panel display apparatus, including a gate electrode disposed on a substrate, a first insulating layer disposed on the gate electrode, a semiconductor layer disposed on the first insulating layer and including a transparent conductive oxide, a capacitor first electrode extending on a same plane as that on which the gate electrode extends, and a capacitor second electrode extending on a same plane as that on which the semiconductor layer extends and including a same material as the semiconductor layer, wherein the first insulating layer is interposed between the capacitor second electrode and the semiconductor layer, source and drain electrodes that are separated by a second insulating layer and are connected to the semiconductor layer and the capacitor second electrode, a third insulating layer covering the source electrode and the drain electrode, and a pixel electrode disposed on the third insulating layer and electrically connected to one of the source electrode and the drain electrode.

The gate electrode may include a transparent conductive layer, and a metallic layer disposed on the transparent conductive layer.

The capacitor first electrode may include a same material as the transparent conductive layer of the gate electrode.

Outer etched surfaces of the transparent conductive layer and the metallic layer may be disposed on a same plane.

The capacitor first electrode may include at least one of indium tin oxide (ITO), indium zinc oxide (IZO), zinc oxide (ZnO), indium oxide ($In_2O_3$), indium gallium oxide (IGO), and/or aluminium zinc oxide (AZO).

The transparent conductive oxide may include oxygen (O) and at least one of gallium (Ga), Indium (In), zinc (Zn), and/or tin (Sn).

The first insulating layer may have a higher permittivity than the third insulating layer.

The first insulating layer may include an inorganic insulating material and the third insulating layer may include an organic insulating material.

The apparatus may further include a data interconnection line disposed on the same plane on which the source electrode and drain electrode are disposed and via which a data voltage to the source electrode and the drain electrode is applied.

The third insulating layer may be thicker than the first insulating layer.

A portion of the second insulating layer on the capacitor second electrode may be removed and the capacitor second electrode may directly contact the third insulating layer.

A capacitor third electrode may be disposed on a portion of the capacitor second electrode corresponding to the removed portion of the second insulating layer, and may include a same material as the source electrode and the drain electrode.

The first insulating layer and the second insulating layer may include a same insulating material.

The first insulating layer and the second insulating layer may include silicon oxide (SiOx).

The pixel electrode may directly contact the capacitor second electrode through a via-hole in the third insulating layer.

The pixel electrode may be a transparent electrode.

The display apparatus may further include an opposite electrode facing the pixel electrode, wherein liquid crystals may be present between the pixel electrode and the opposite electrode.

A common voltage Vcom, a gate high signal Vgh, or gate low signal Vgl may be applied to the capacitor first electrode.

The display apparatus may further include an opposite electrode facing the pixel electrode, wherein an organic emission layer may be formed between the pixel electrode and the opposite electrode.

At least one of the above and other features and advantages may be realized by providing a method of manufacturing a flat panel display apparatus, the method including forming a gate electrode of a thin film transistor and a capacitor first electrode on a substrate using a first mask, forming a semiconductor layer of the thin film transistor and a capacitor second electrode using a second mask, wherein the semiconductor layer and the capacitor second electrode are separated from the gate electrode and the capacitor first electrode be a first insulating layer, forming, using a third mask, a second insulating layer and contact holes exposing a portion of the semiconductor layer and a portion of the capacitor second electrode through the second insulating layer, forming, using a fourth mask, source and drain electrodes connected to the semiconductor layer and the capacitor second electrode via the contact holes, forming a third insulating layer and a via-hole using a fifth mask, and forming a pixel electrode connected to any one of the source and drain electrodes via the via-hole using a sixth mask.

The gate electrode may include a transparent conductive layer and a metallic layer disposed on the transparent conductive layer, and, and using the first mask, the capacitor first electrode and the transparent conductive layer may be formed on a same plane and may include a same material.

The first mask may include a half-tone mask including a light-transmission portion, a semi-transmission portion corresponding to the capacitor first electrode, and a light-blocking portion corresponding to the gate electrode.

Each of the semiconductor layer and the capacitor second electrode may include a transparent conductive oxide.

The method may further include removing a portion of the second insulating layer corresponding to the capacitor second using the third mask.

The method may further include forming a capacitor third electrode on a portion of the substrate corresponding to the removed portion of the second insulating layer, and includes a same material as the source and drain electrodes.

Additional aspects will be set forth in part in the description which follows and, in part, will be apparent from the description, or may be learned by practice of the presented embodiments.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
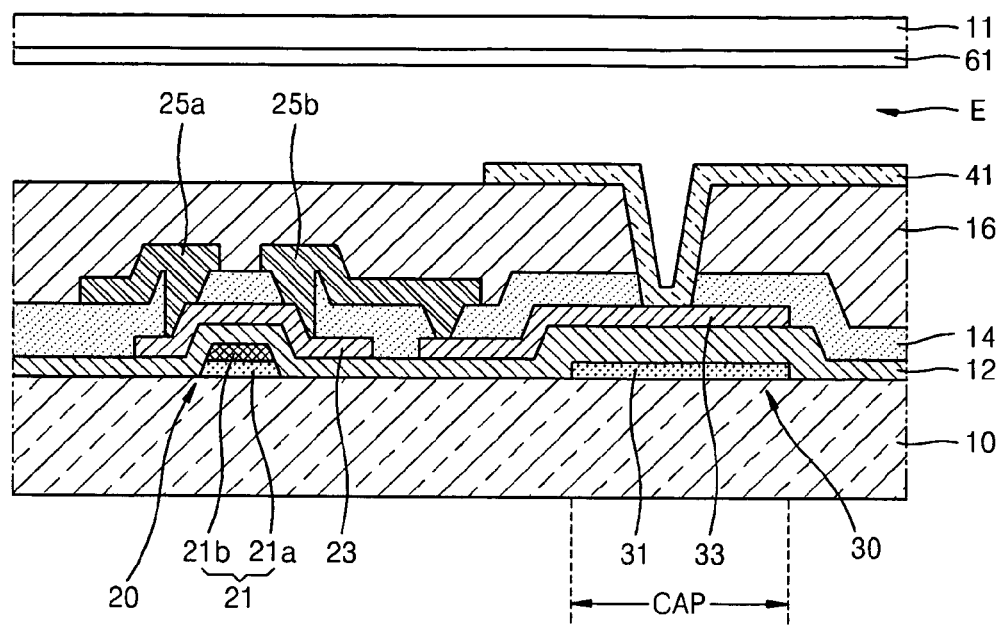
FIG. 1 illustrates a schematic sectional-view of a flat panel display apparatus according to an exemplary embodiment.

Korean Patent Application No. 10-2010-0057567, filed on Jun. 17, 2010, in the Korean Intellectual Property Office, and entitled: "Flat Panel Display Apparatus and Method of Manufacturing the Same," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when an element is referred to as being "on," "above", "below," or "under" another element, it can be directly "on," "above", "below," or "under" the other element, respectively, or intervening elements may also be present. In addition, it will also be understood that when an element is referred to as being "between" two elements, it can be the only element between the two elements, or one or more intervening elements may also be present.

It will be also be understood that although the terms first, second, third etc.

may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. Like reference numerals refer to like elements throughout the specification.

FIG. 1 illustrates a schematic sectional-view of a flat panel display apparatus according to an exemplary embodiment.

Referring to FIG. 1, the flat panel display apparatus may include a substrate 10, a capacitor 30 including capacitor first and second electrodes 31 and 33, a first insulating layer 12, a second insulating layer 14, a pixel electrode 41, a third insulating layer 16, and a thin film transistor 20 including a gate electrode 21, a semiconductor 23, and source and drain electrodes 25a and 25b. The gate electrode 21 and the capacitor first electrode 31 may extend on a same plane. More particularly, e.g., the gate electrode 21 and the capacitor first electrode 31 may both extend on the substrate 10. The semiconductor layer 23 and the capacitor second electrode 33 may extend on a same plane. The semiconductor layer 23 and the capacitor second electrode 33 may include a same material, e.g., a transparent conductive oxide. The first insulating layer 12 may be formed between the capacitor first electrode 31 and the capacitor second electrode 33. The second insulating layer 14 may be formed on the capacitor second electrode 33. The third insulating layer 16 may be formed between the pixel electrode 41 and the source and drain electrodes 25a and 25b. The third insulating layer 16 may have a lower permittivity than the first insulating layer 12.

In some embodiments, the flat panel display apparatus may further include a second substrate 11 and an electrode 61, e.g., a common electrode, on the second substrate 11. More particularly, the electrode 61 may be arranged opposite, e.g., overlapping with, the pixel electrode 41. Emission material E such as, e.g., liquid crystals and/or an organic emission layer, etc. may be provided between the pixel electrode 41 and the electrode 61.

FIGS. 2A through 2F illustrate schematic sectional-views of stages in an exemplary embodiment of a method of manufacturing the flat panel display apparatus of FIG. 1.

Figure 2A:
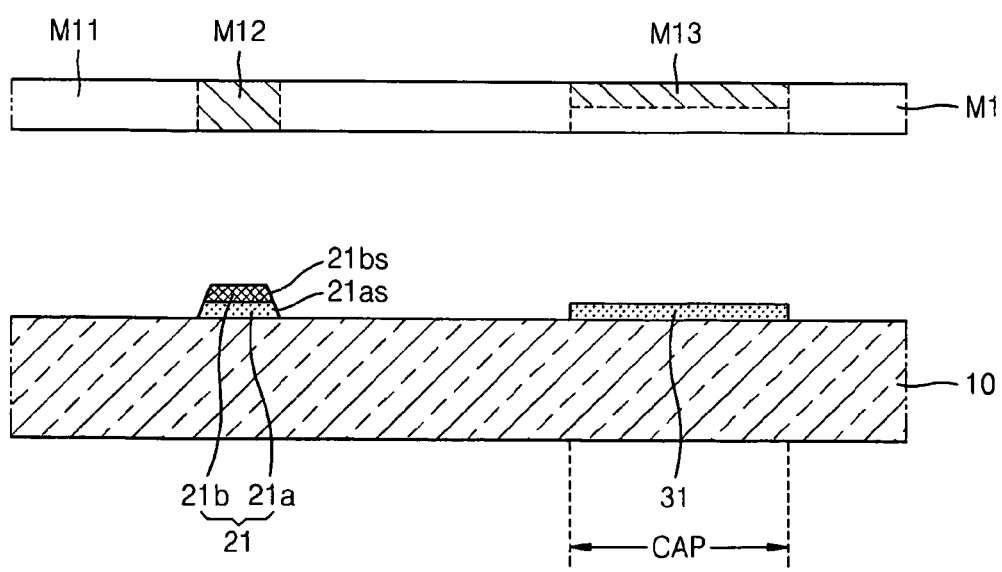
FIGS. 2A through 2F illustrate schematic sectional-views of stages in an exemplary embodiment of a method of manufacturing the flat panel display apparatus of FIG. 1.

Referring to FIG. 2A, a first mask process may be performed using a first photomask M1. More particularly, referring to FIG. 2A, the first photomask M1 may be employed to form the gate electrode 21 and the capacitor first electrode 31 formed on the substrate 10.

The first photomask M1 may be a half-tone mask including a light-transmission portion M11, a light-blocking portion M12, and a semi-transmission portion M13. The light-blocking portion M12 may be arranged at a location corresponding to, e.g., overlapping, a location of the gate electrode 21 on the substrate 10. The light-blocking portion M12 may have a pattern corresponding to a pattern of the gate electrode 21. The semi-transmission portion M13 may be arranged at a location corresponding to, e.g., overlapping, a location of the capacitor first electrode 31 on the substrate 10. The semi-transmission portion M13 may have a pattern corresponding to a pattern of the capacitor first electrode 31.

The substrate 10 may include a transparent glass material. The substrate 10 may include, e.g., $SiO_2$. A buffer layer (not shown) including silicon oxide and/or silicon nitride may be further formed on the substrate 10 so as to planarize a surface of the substrate 10 and to prevent permeation of impurity elements.

The gate electrode 21 may include a first layer 21a and a second layer 21b. The second layer 21 b may be arranged above the first layer 21a. The first layer 21a may include a transparent conductive material. More particularly, e.g., the first layer 21a may include at least one transparent conductive material such as indium tin oxide (ITO), indium zinc oxide (IZO), zinc oxide (ZnO), indium oxide: ($In_2O_3$), indium gallium oxide (IGO), and/or aluminium zinc oxide (AZO). The second layer 21b may include a metallic material. More particularly, e.g., the second layer 21b may include at least one metallic material such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), MoW, and/or Al/Cu.

Although not illustrated in FIG. 2A, a transparent conductive layer (not shown) for forming the first layer 21a and a metallic layer (not shown) for forming the second layer 21b may be sequentially formed on the substrate 10. A photoresist (not shown) may be selectively coated on the metallic layer (not shown), and the metallic layer may be exposed to light through the first photomask M1 using an exposure equipment. After exposure, a resultant structure may be subjected to a series of processes such as developing, etching, and stripping or ashing.

Since the light-blocking portion M12 of the first photomask M1 may be arranged at a location corresponding to the gate electrode 21, the first layer 21a of the gate electrode 21 and the second layer 21b of the gate electrode 21 may be simultaneously etched using the first photomask M1. Thus, an outer etched surface 21as of the first layer 21a and an outer etched surface 21bs of the second layer 21b may extend on a same plane, i.e., may be aligned with each other.

The capacitor first electrode 31 may be spaced apart from the gate electrode 21. The capacitor first electrode 31 may be formed on a same plane on which the gate electrode 21 is formed.

The capacitor first electrode 31 and the first layer 21a of the gate electrode 21 may include a same material. More particularly, e.g., the capacitor first electrode 31 may include at least one of indium tin oxide (ITO), indium zinc oxide (IZO), zinc oxide (ZnO), indium oxide ($In_2O_3$), indium gallium oxide (IGO), and/or aluminium zinc oxide (AZO).

Although not illustrated in FIG. 2A, in regard to the capacitor first electrode 31, among the transparent conductive layer for forming the first layer 21a of the gate electrode 21 and the metallic layer for forming the second layer 21b of the gate electrode 21, the metallic layer for forming the second layer 21b may be removed by using the first photomask M1 including the semi-transmission portion M13. Thus, only the transparent conductive layer for forming the first layer 21a may remain, thereby forming the capacitor first electrode 31.

Figure 2B:
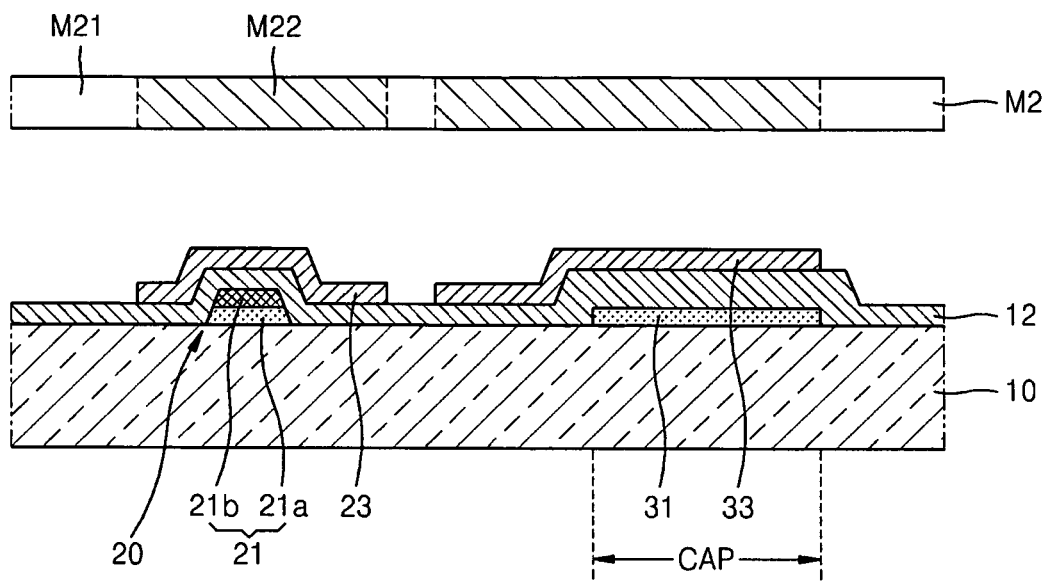

Referring to FIG. 2B, a second mask process may be performed using a second photomask M2. More particularly, referring to FIG. 2B, the second photomask M2 may be employed to form the semiconductor layer 23 of the thin film transistor 20 and the capacitor second electrode 33. The semiconductor layer 23 and the capacitor second electrode 33 may be formed on the first insulating layer 12.

The second photomask M2 may include a light-transmission portion M21 and a light-blocking portion M22 corresponding to the semiconductor layer 23 and the capacitor second electrode 33. Accordingly, the semiconductor layer 23 and the capacitor second electrode 33 may be formed by using the same mask process.

The first insulating layer 12 may be interposed between the gate electrode 21 and the semiconductor layer 23. Between the gate electrode 21 and the semiconductor layer 23 of the thin film transistor 20, the first insulating layer 12 may function as a gate insulating layer for the thin film transistor 20. The first insulating layer 12 may be interposed between the capacitor first electrode 31 and the capacitor second electrode 33. Between the capacitor first electrode 31 and the capacitor second electrode 33, the first insulating layer 12 may function as a dielectric layer of the capacitor 30.

The first insulating layer 12 may be a transparent inorganic insulating layer. The first insulating layer 12 may include, e.g., silicon oxide, silicon nitride, etc.

The first insulating layer 12 may have a higher permittivity than the third insulating layer 16, which will be described in more detail below. Thus, a capacitance of the capacitor 30 may be increased.

Each of the semiconductor layer 23 and the capacitor second electrode 33 may include, e.g., a transparent conductive oxide. More particularly, e.g., the transparent conductive oxide may include, e.g., oxygen (O) and at least one of gallium (Ga), Indium (In), zinc (Zn), and/or tin (Sn), etc. For example, the transparent conductive oxide may include at least one of indium gallium zinc oxide (InGaZnO), indium gallium hafnium oxide (InGaHfO), indium zinc hafnium oxide (InZnHfO), and/or indium gallium tin oxide (InGaSnO), etc.

In embodiments, the capacitor first electrode 31 and the capacitor second electrode 33 may both include a material with high light transmissibility as described above. Embodiments may provide flat panel display apparatus having improved aperture ratio and transmissibility relative to comparable conventional devices.

Figure 2C:
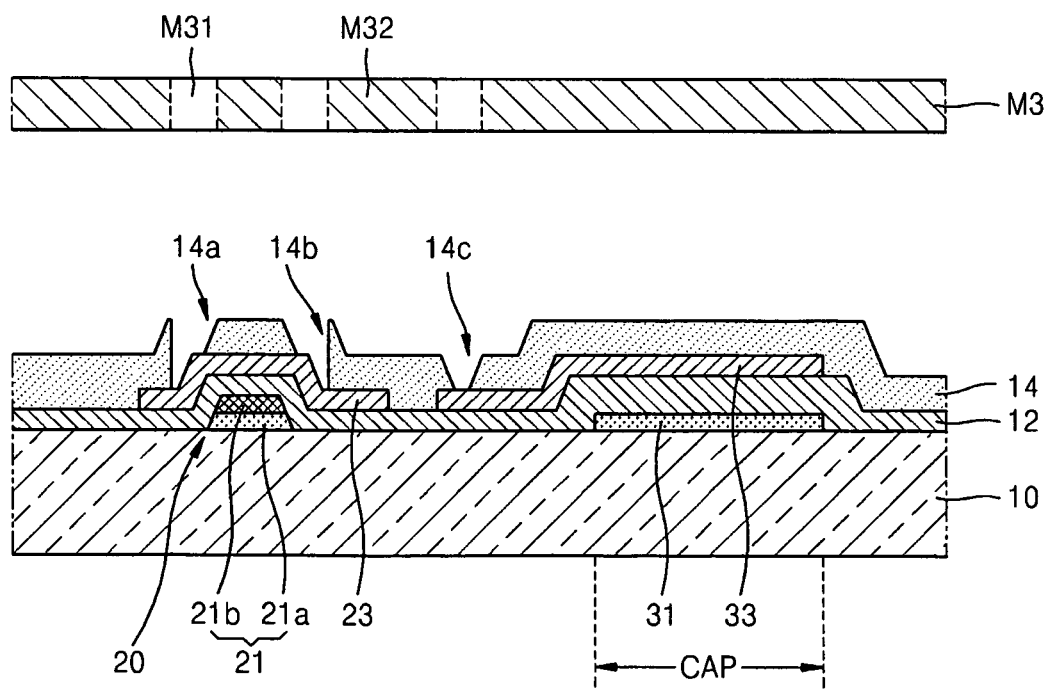

Referring to FIG. 2C, a third mask process may be performed using a third photomask M3. More particularly, referring to FIG. 2C, the third photomask M3 may be employed to form a plurality of contact holes, e.g., 14a, 14b, and 14c, in the second insulating layer 14.

The third photomask M3 may include a light-transmission portion M31, and a light-blocking portion M32. The light-transmission portion M31 may correspond to side portions of the semiconductor layer 23 and a portion of the capacitor second electrode 33.

Although in FIG. 2C the contact hole 14c that exposes a portion of the capacitor second electrode 33 is located outside a capacitor region CAP in which the capacitor first electrode 31 and the capacitor second electrode 33 overlap, the location of the contact hole 14c is not limited thereto. For example, the contact hole 14c may be located closer to the capacitor first electrode 31 than that illustrated in FIG. 2C. More particularly, e.g., the contact hole 14c may be located so as to overlap a portion of the capacitor second electrode 33 in the capacitor region CAP in which the capacitor first electrode 31 and the capacitor second electrode 33 overlap each other.

The second insulating layer 14 may be formed on a channel region of the semiconductor layer 23 corresponding to the gate electrode 21. The second insulating layer 14 may function as an etch stopper.

Like the first insulating layer 12, the second insulating layer 14 may be a transparent inorganic insulating layer including, e.g., silicon oxide, silicon nitride, etc.

Figure 2D:
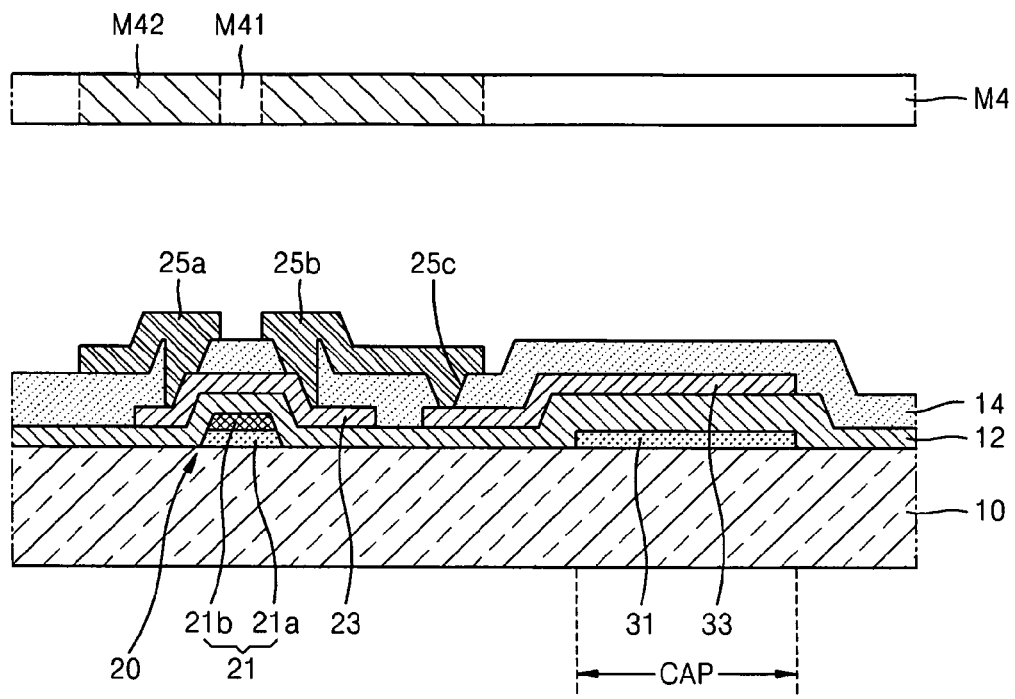

Referring to FIG. 2D, a fourth mask process may be performed using a fourth photomask M4. More particularly, referring to FIG. 2D, the fourth photomask M4 may be employed to form the source electrode 25a and the drain electrode 25b on the second insulating layer 14.

The fourth photomask M4 may include a light-transmission portion M41, and a light-blocking portion M42. The light-blocking portion M42 may correspond to, e.g., overlap with an area above the substrate 10 where the source electrode 25a and the drain electrode 25b may be formed.

One of the source electrode 25a and the drain electrode 25b may be connected to the capacitor second electrode 33 via the contact hole 14c.

Figure 2E:
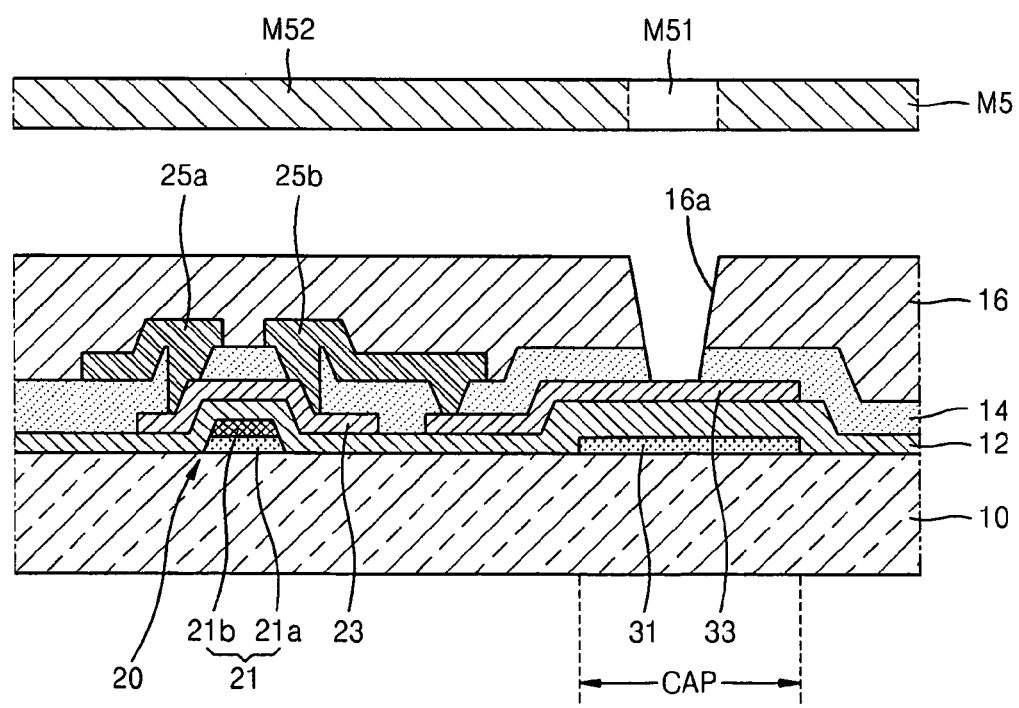

Referring to FIG. 2E, a fifth mask process may be performed using a fifth photomask M5. More particularly, referring to FIG. 2E, the fifth photomask M5 may be employed to form a via-hole 16a in the third insulating layer 16.

The fifth photomask M5 may include a light-transmission portion M51, and a light-blocking portion M52. The light-transmission portion M51 may correspond to a portion of the capacitor second electrode 33.

The third insulating layer 16 may include an insulating material with a lower permittivity than that of the first insulating layer 12. In addition, the third insulating layer 16 may be thicker than the first insulating layer 12. The third insulating layer 16 may be an organic insulating layer.

A data interconnection line (not shown) for applying a data voltage to the source electrode 25a and the drain electrode 25b may be formed on a same plane, e.g., level relative to the substrate 10, as a plane on which the source electrode 25a and the drain electrode 25b are formed. In this regard, data interconnection lines (not shown) located between adjacent pixels may result in a parasitic capacitance between the pixel electrodes 41 of the adjacent pixels. Such parasitic capacitance may affect data signals of adjacent pixels. To reduce the effect of the formed parasitic capacitor, a black matrix is generally provided between adjacent pixels.

In embodiments employing one or more aspects described herein, a parasitic capacitance effect on data signals of adjacent pixels may be reduced and/or eliminated by providing the third insulating layer 16 with relatively low permittivity between the pixel electrode 41 and the data interconnection line extending along the same plane, e.g., same level relative to the substrate 10, on which the source electrode 25a and the drain electrode 25b are formed. In embodiments, a thickness of the third insulating layer 16 may be relatively large and thus, a magnitude of such a parasitic capacitance may be reduced. Thus, embodiments eliminate a need for providing a black matrix between adjacent pixels, and thus a manufacturing process and manufacturing costs may be reduced. More particularly, while such a black matrix may be provided, embodiments may no longer require such a black matrix as a result of parasitic capacitance.

Referring to FIG. 2E, the via-hole 16a may expose a portion of the capacitor second electrode 33 in the capacitor region CAP in which the capacitor first electrode 31 and the capacitor second electrode 33 overlap. However, in embodiments, the structure of the via-hole 16a is not limited thereto. For example, the via-hole 16a may directly expose any one the source electrode 25a and the drain electrode 25b.

Figure 2F:
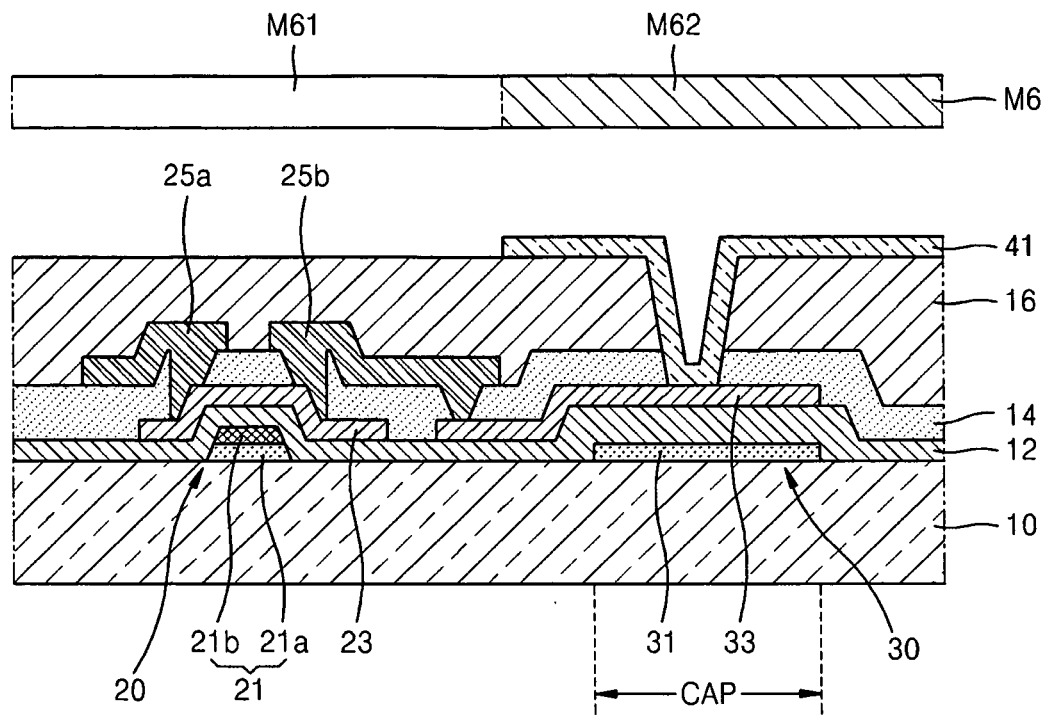

Referring to FIG. 2F, a sixth mask process may be performed using a sixth photomask M6. More particularly, referring to FIG. 2F, the sixth photomask M6 may be employed to form the pixel electrode 41 formed on the third insulating layer 16.

The sixth photomask M6 may include a light-transmission portion M51, and a light-blocking portion M52. The light-blocking portion M52 may correspond to the pixel electrode 41.

In embodiments in which the flat panel display apparatus is a transmission-type or semi-transmission-type liquid crystal display apparatus or a bottom emission-type or bi directional emission-type organic light-emitting display apparatus, the pixel electrode 41 may be a transparent electrode.

In some embodiments, an opposite electrode, e.g., common electrode 61, may be further disposed to overlap the pixel electrode 41 and emission material E, e.g., liquid crystals, organic emission layer, etc. may be provided between the pixel electrode 41 and the opposite electrode, e.g., 61. In some embodiments, a common voltage Vcom, a high level voltage Vgh, or a low level voltage Vgl may be directly applied to the capacitor first electrode 31. The common voltage Vcom may correspond to a voltage applied to the common electrode, e.g., 61. The high level voltage Vgh and the low level voltage Vgl may correspond to a high level voltage and a low level voltage that may be applied to a gate of the thin film transistor 20, respectively.

In embodiments of the flat panel display apparatus, each of the capacitor first electrode 31 and the capacitor second electrode 33 may include a light transmissible material. Thus, embodiments may enable an aperture ratio and/or transmissibility of the flat panel display apparatus to be improved. In addition, in embodiments, by employing the first insulating layer 12 with high permittivity as a dielectric layer of a capacitor, the capacitance of the capacitor 30 may be increased. Furthermore, by employing the third insulating layer 16 with low permittivity data interposed between the interconnection line and the pixel electrode 41, a parasitic capacitance effect on adjacent pixels may be reduced.

Figure 3:
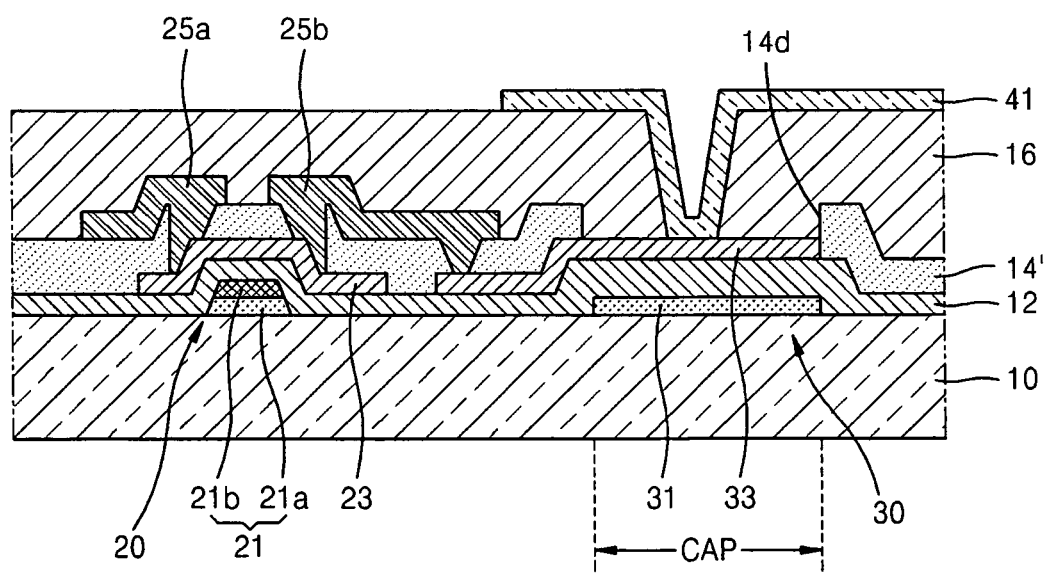
FIG. 3 illustrates a schematic sectional-view of a flat panel display apparatus according to another exemplary embodiment.

FIG. 3 illustrates a schematic sectional-view of a flat panel display apparatus according to another exemplary embodiment. Like reference numerals denote like elements throughout the description. Further, in general, only differences between the exemplary embodiment of FIG. 1 and the exemplary embodiment of FIG. 3 will be described below.

Referring to FIG. 3, in some embodiments, a portion of the second insulating layer 14' formed on the capacitor second electrode 33 may be removed. Removal of the portion of the second insulating layer 14' may be simultaneously formed together with the formation of the contact holes 14a, 14b, and 14c. More particularly, removal of the portion of the second insulating layer 14' may occur while forming the contact holes 14a, 14b, and 14c using the third mask M3, as described in the previous embodiment.

By removing the portion of the second insulating layer 14' formed on the capacitor second electrode 33, when the flat panel display apparatus is a transmission-type or semi-transmission-type liquid crystal display apparatus or a bottom emission-type or bi directional emission-type organic light-emitting display apparatus, transmissibility of the flat panel display apparatus may be further improved.

In FIG. 3, a portion of the second insulating layer 14' corresponding to the capacitor second electrode 33 is removed. However, the structure of the second insulating layer 14 is not limited thereto. For example, in some embodiments, only a portion of the second insulating layer 14 that corresponds to the channel region of the semiconductor layer 23 and functions as an etch stopper may be maintained.

Figure 4:
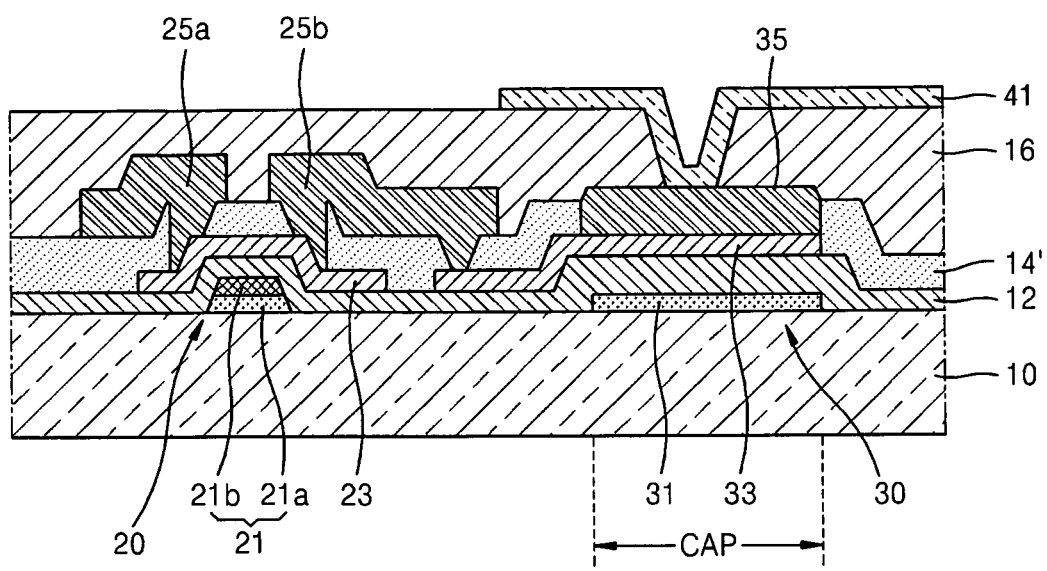
FIG. 4 illustrates a schematic sectional-view of a flat panel display apparatus according to another exemplary embodiment.

FIG. 4 illustrates a schematic sectional-view of a flat panel display apparatus according to another exemplary embodiment. Like reference numerals denote like elements throughout the description. Further, in general, only differences between the exemplary embodiment of FIG. 1 and the exemplary embodiment of FIG. 4 will be described below.

Referring to FIG. 4, a portion of the second insulating layer 14' formed on the capacitor second electrode 33 may be removed and a capacitor third electrode 35 may be provided. The capacitor third electrode 35 may be formed on a portion of the capacitor second electrode 33 corresponding to the removed portion of the second insulating layer 14. In such embodiments, the first insulating layer 14 and the second insulating layer 14 may include a same material, e.g., silicon oxide.

The capacitor third electrode 35 may be simultaneously formed together with the formation of the source electrode 25a and the drain electrode 25b during the fourth mask process described above. The capacitor third electrode 35 and the source and drain electrodes 25a and 25b may be formed of the same material.

If a capacitor includes the capacitor first electrode 31 formed on the same plane on which the gate electrode 21 is formed and the capacitor third electrode 35 formed on the same plane on which the source and drain electrodes 25a and 25b are formed, the first insulating layer 12 and the second insulating layer 14 between the capacitor first electrode 31 and the capacitor third electrode 35 may function as a dielectric layer. That is, in such embodiments, a plurality of dielectric layers, e.g., two dielectric layers, may be interposed between the two capacitor electrodes 31, 35. Thus, a capacitance of a capacitor 30 may be reduced as compared to cases in which one dielectric layer is interposed between the capacitor electrodes 31, 35. To compensate for the reduced capacitance, an area of the capacitor 30 may be increased, and as the capacitance thereof may be increased. Further, embodiments may enable an aperture ratio and the transmissibility to be decreased. More particularly, in embodiments, one dielectric layer may be interposed between the two capacitor electrodes and, thus, a decrease in the capacitance of the capacitor may be prevented.

The first insulating layer 12 functioning as a gate insulating layer that directly contacts the semiconductor layer 23 and the second insulating layer 14 functioning as an etch stopper may be formed of silicon oxide containing a small amount of hydrogen so as to improve characteristics of a semiconductor device. However, if the first insulating layer 12 and the second insulating layer 14 are both formed of silicon oxide, when the second insulating layer 14 is etched, the first insulating layer 12 may also be damaged. However, in the present embodiment, the capacitor second electrode 33 including a transparent conductive oxide semiconductor is interposed between the second insulating layer 14 and the first insulating layer 12 and thus prevents etching of the first insulating layer 12. Accordingly, the second insulating layer 14 is etched without damage to the first insulating layer 12 and thus, a capacity of the capacitor is increased and characteristics of a semiconductor device may be improved.

Referring to FIG. 4, in some embodiments, only a portion of the second insulating layer 14' corresponding to the capacitor first electrode 31 may be removed. However, a structure of the second insulating layer 14' is not limited thereto. For example, only a portion of the second insulating layer 14', which may correspond to the channel region of the semiconductor layer 23 and may be adapted, to function as an etch stopper may be maintained.

As described above, in flat panel display apparatuses according to one or more embodiments above, two capacitor electrodes may be transparent electrodes and thus, the aperture ratio and transmissibility of the flat panel display apparatuses may be improved.

In addition, since a single insulating layer with high permittivity is used as a dielectric layer of a capacitor, even when the size of the capacitor is reduced, a capacitance of the capacitor may not be reduced and the aperture ratio and transmissibility of the flat panel display apparatuses may be improved.

In embodiments, by providing an organic insulating layer with low permittivity between, a data interconnection line (not shown) and a pixel electrode 41, a black matrix may not be required between adjacent pixels, and thus a manufacturing process and manufacturing costs may be reduced.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A flat panel display apparatus, comprising:
a gate electrode disposed on a substrate;
a first insulating layer disposed on the gate electrode;
a semiconductor layer disposed on the first insulating layer and including a transparent conductive oxide;
a capacitor first electrode extending on a same plane as that on which the gate electrode extends, and a capacitor second electrode extending on a same plane as that on which the semiconductor layer extends and including a same material as the semiconductor layer, wherein the first insulating layer is interposed between the capacitor first electrode and the capacitor second electrode;
a second insulating layer on the semiconductor layer and on the capacitor second electrode;
source and drain electrodes that are separated by the second insulating layer and are connected to the semiconductor layer and the capacitor second electrode;
a third insulating layer covering the source electrode and the drain electrode; and
a pixel electrode disposed on the third insulating layer and electrically connected to one of the source electrode and the drain electrode, wherein the pixel electrode directly contacts the capacitor second electrode through a via-hole in the second insulating layer and third insulating layer.

2. The flat panel display apparatus as claimed in claim 1, wherein the gate electrode includes a transparent conductive layer, and a metallic layer disposed on the transparent conductive layer.

3. The flat panel display apparatus as claimed in claim 2, wherein the capacitor first electrode includes a same material as the transparent conductive layer of the gate electrode.

4. The flat panel display apparatus as claimed in claim 2, wherein outer etched surfaces of the transparent conductive layer and the metallic layer are disposed on a same plane.

5. The flat panel display apparatus as claimed in claim 1, wherein the capacitor first electrode includes at least one of indium tin oxide (ITO), indium zinc oxide (IZO), zinc oxide (ZnO), indium oxide ($In_2O_3$), indium gallium oxide (IGO), and/or aluminum zinc oxide (AZO).

6. The flat panel display apparatus as claimed in claim 1, wherein the transparent conductive oxide includes oxygen (O) and at least one of gallium (Ga), indium (In), zinc (Zn), and/or tin (Sn).

7. The flat panel display apparatus as claimed in claim 1, wherein the first insulating layer has a higher permittivity than the third insulating layer.

8. The flat panel display apparatus as claimed in claim 1, wherein the first insulating layer includes an inorganic insulating material and the third insulating layer includes an organic insulating material.

9. The flat panel display apparatus as claimed in claim 1, further comprising a data interconnection line disposed on the same plane on which the source electrode and drain electrode are disposed and via which a data voltage to the source electrode and the drain electrode is applied.

10. The flat panel display apparatus as claimed in claim 1, wherein the third insulating layer is thicker than the first insulating layer.

11. The flat panel display apparatus as claimed in claim 1, wherein the pixel electrode is a transparent electrode.

12. The flat panel display apparatus as claimed in claim 1, further comprising an opposite electrode facing the pixel electrode, wherein liquid crystals are present between the pixel electrode and the opposite electrode.

13. The flat panel display apparatus as claimed in claim 12, wherein a common voltage Vcom, a gate high signal Vgh, or gate low signal Vgl is applied to the capacitor first electrode.

14. The flat panel display apparatus as claimed in claim 1, further comprising an opposite electrode facing the pixel electrode, wherein an organic emission layer is formed between the pixel electrode and the opposite electrode.

15. A flat panel display apparatus, comprising:
a gate electrode disposed on a substrate;
a first insulating layer disposed on the gate electrode;
a semiconductor layer disposed on the first insulating layer and including a transparent conductive oxide;
a capacitor first electrode extending on a same plane as that on which the gate electrode extends, and a capacitor second electrode extending on a same plane as that on which the semiconductor layer extends and including a same material as the semiconductor layer, wherein the first insulating layer is interposed between the capacitor first electrode and the capacitor second electrode;
a second insulating layer on the semiconductor layer and on the capacitor second electrode,
source and drain electrodes that are separated by a second insulating layer and are connected to the semiconductor layer and the capacitor second electrode;
a third insulating layer covering the source electrode and the drain electrode; and
a pixel electrode disposed on the third insulating layer and electrically connected to one of the source electrode and the drain electrode,
wherein a portion of the second insulating layer on the capacitor second electrode is removed and the capacitor second electrode directly contacts the third insulating layer.

16. The flat panel display apparatus as claimed in claim 15, further comprising a capacitor third electrode that is disposed on a portion of the capacitor second electrode corresponding to the removed portion of the second insulating layer, and includes a same material as the source electrode and the drain electrode.

17. The flat panel display apparatus as claimed in claim 16, wherein the first insulating layer and the second insulating layer include a same insulating material.

18. The flat panel display apparatus as claimed in claim 17, wherein the first insulating layer and the second insulating layer include silicon oxide (SiOx).

19. The flat panel display apparatus as claimed in claim 15, wherein the pixel electrode directly contacts the capacitor second electrode through a via-hole in the third insulating layer.

* * * * *